(12) United States Patent
Chen et al.

(10) Patent No.: US 10,431,655 B2
(45) Date of Patent: Oct. 1, 2019

(54) TRANSISTOR STRUCTURE

(71) Applicant: United Microelectronics Corp., Hsinchu (TW)

(72) Inventors: Yen-Ming Chen, New Taipei (TW); Chiu-Ling Lee, Hsinchu (TW); Min-Hsuan Tsai, Tainan (TW); Chiu-Te Lee, Hsinchu County (TW); Chih-Chung Wang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/924,001

(22) Filed: Mar. 16, 2018

(65) Prior Publication Data

US 2019/0245041 A1    Aug. 8, 2019

(30) Foreign Application Priority Data

Feb. 7, 2018    (CN) .......................... 2018 1 0123483

(51) Int. Cl.
*H01L 29/10* (2006.01)
*H01L 29/06* (2006.01)
*H01L 29/78* (2006.01)
*H01L 29/08* (2006.01)

(52) U.S. Cl.
CPC ...... *H01L 29/1079* (2013.01); *H01L 29/0649* (2013.01); *H01L 29/0865* (2013.01); *H01L 29/0882* (2013.01); *H01L 29/1095* (2013.01); *H01L 29/7816* (2013.01); *H01L 29/7835* (2013.01)

(58) Field of Classification Search
CPC ............... H01L 29/1079; H01L 29/064; H01L 29/0865; H01L 29/0882; H01L 29/1095; H01L 29/7816; H01L 29/7835; H01L 29/0638; H01L 29/66916; H01L 21/265; H01L 21/324; H01L 29/8086; H01L 21/74; H01L 21/823493; H01L 21/823892; H01L 29/0623; H01L 29/1033; H01L 29/407
See application file for complete search history.

(56) References Cited

U.S. PATENT DOCUMENTS

| | | | |
|---|---|---|---|
| 6,882,023 B2 | 4/2005 | Khemka et al. | |
| 6,894,348 B2 | 5/2005 | Terashima | |
| 7,960,222 B1 | 6/2011 | Kwon | |
| 9,263,574 B1 | 2/2016 | Kumar et al. | |
| 2008/0173951 A1* | 7/2008 | Ma .................. | H01L 21/823892 257/372 |
| 2011/0057262 A1* | 3/2011 | Ma ...................... | H01L 27/0629 257/337 |

(Continued)

*Primary Examiner* — Shahed Ahmed
(74) *Attorney, Agent, or Firm* — J.C. Patents

(57) ABSTRACT

A transistor structure including a substrate, a transistor device, a split buried layer, and a second buried layer is provided. The substrate has a device region. The transistor device is located in the device region. The split buried layer is located under the transistor device in the substrate and includes first buried layers separated from each other. The second buried layer is located under the split buried layer in the substrate and connects the first buried layers. The second buried layer and the split buried layer have a first conductive type. The transistor structure may have a higher breakdown voltage.

20 Claims, 1 Drawing Sheet

(56) References Cited

U.S. PATENT DOCUMENTS

| | | | |
|---|---|---|---|
| 2014/0070315 A1* | 3/2014 | Levy | H01L 29/0634 |
| | | | 257/343 |
| 2015/0041894 A1* | 2/2015 | Hebert | H01L 29/7816 |
| | | | 257/339 |
| 2015/0236087 A1* | 8/2015 | Chang | H01L 29/0619 |
| | | | 257/339 |

* cited by examiner

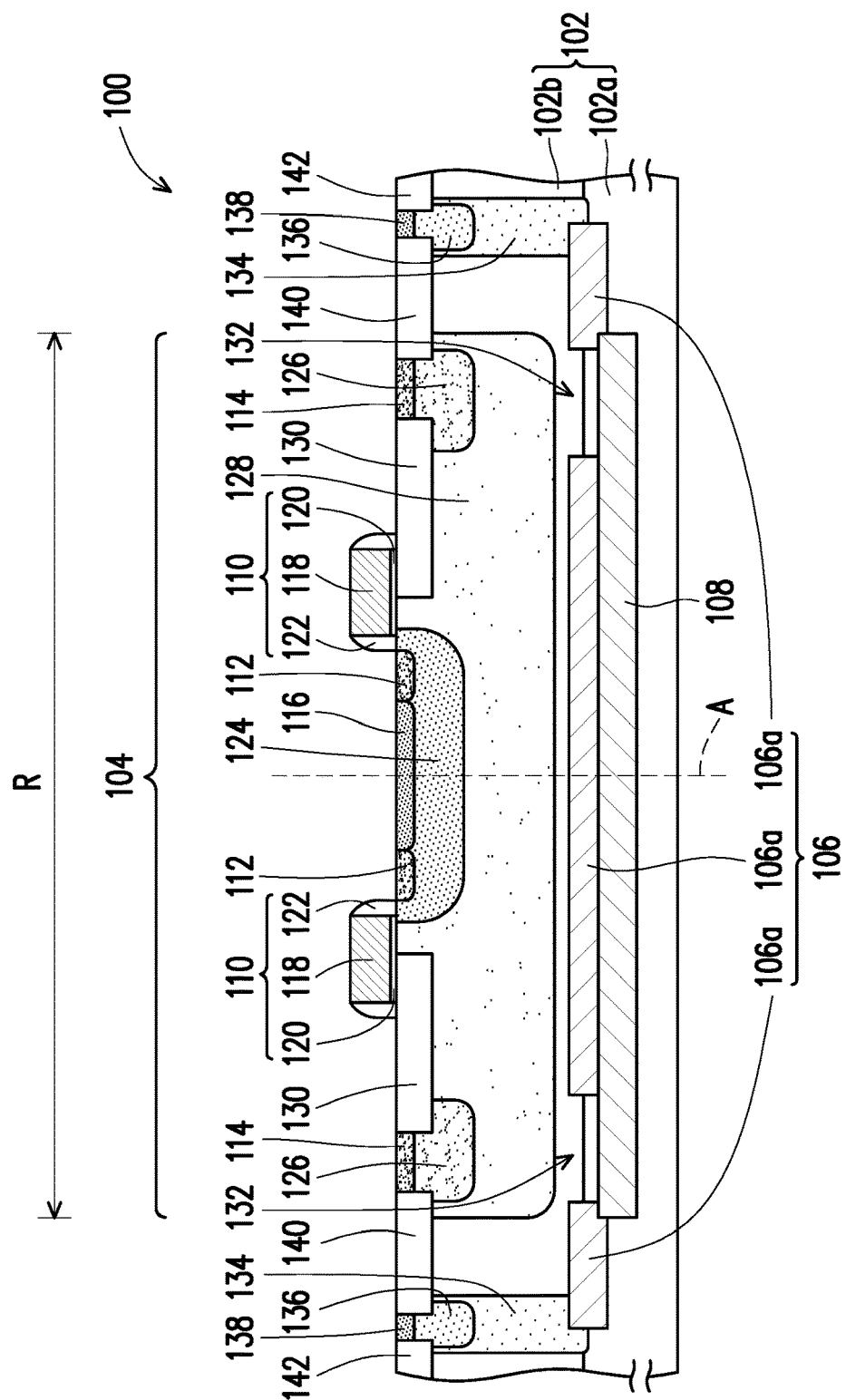

TRANSISTOR STRUCTURE

CROSS-REFERENCE TO RELATED APPLICATION

This application claims the priority benefit of China application serial no. 201810123483.2, filed on Feb. 7, 2018. The entirety of the above-mentioned patent application is hereby incorporated by reference herein and made a part of this specification.

BACKGROUND OF THE INVENTION

1. Field of the Invention

The invention relates to a semiconductor structure. More particularly, the invention relates to a transistor structure.

2. Description of Related Art

In integrated circuit devices, different circuits need different circuit devices with different basic operational characteristics to coordinate/operate with closely. A high-voltage transistor device, as implied by the name, is a transistor device that can be operated at relatively high voltage bias. That is, the breakdown voltage of the high-voltage transistor device is higher than that of the general transistor device.

Nevertheless, how to increase the breakdown voltage of the high-voltage transistor is an important issue to be addressed.

SUMMARY OF THE INVENTION

The invention provides a transistor structure having a higher breakdown voltage.

A transistor structure provided by an embodiment of the invention includes a substrate, a transistor device, a split buried layer, and a second buried layer. The substrate has a device region. The transistor device is located in the device region. The split buried layer is located under the transistor device in the substrate and includes first buried layers separated from each other. The second buried layer is located under the split buried layer in the substrate and connects the first buried layers. The second buried layer and the split buried layer have a first conductive type.

According to an embodiment of the invention, in the transistor structure, the split buried layer and the second buried layer may form a stepped structure at a position in which the second buried layer and the split buried layer are connected.

According to an embodiment of the invention, in the transistor structure, a portion of the second buried layer overlapping the split buried layer, for example, does not exceed two ends of the split buried layer.

According to an embodiment of the invention, in the transistor structure, the substrate may include a semiconductor substrate and a semiconductor layer. The semiconductor layer is disposed on the semiconductor substrate.

According to an embodiment of the invention, in the transistor structure, the semiconductor substrate and the semiconductor layer, for example, have a second conductive type.

According to an embodiment of the invention, in the transistor structure, the semiconductor layer is, for example, an epitaxial silicon layer.

According to an embodiment of the invention, in the transistor structure, the split buried layer may be located between the semiconductor substrate and the semiconductor layer.

According to an embodiment of the invention, in the transistor structure, a first well region may be further included. The first well region is located at one side of the transistor device in the substrate and is connected to the split buried layer. The first well region has the first conductive type.

According to an embodiment of the invention, in the transistor structure, the split buried layer, the second buried layer, and the first well region may surround the transistor device.

According to an embodiment of the invention, in the transistor structure, a second well region may be further included. The second well region is located in the first well region and has the first conductive type.

According to an embodiment of the invention, in the transistor structure, a first doped region may be further included. The first doped region is located in the second well region and has the first conductive type.

According to an embodiment of the invention, in the transistor structure, a first isolation structure may be further included. The first isolation structure is disposed in the substrate and located between the first well region and the transistor device.

According to an embodiment of the invention, in the transistor structure, the transistor device may include a gate structure, a second doped region, a third doped region, and a fourth doped region. The gate structure is disposed on the substrate. The second doped region and the third doped region are respectively located at one side and the other side of the gate structure in the substrate and have a second conductive type. The fourth doped region is located at one side of the second doped region away from the gate structure in the substrate and has the first conductive type.

According to an embodiment of the invention, in the transistor structure, the transistor device may further include a body region and a drift region. The body region is located at one side of the gate structure in the substrate and has the first conductive type. The second doped region and the fourth doped region may be located in the body region. The drift region is located at the other side of the gate structure in the substrate and has the second conductive type. The third doped region may be located in the drift region.

According to an embodiment of the invention, in the transistor structure, the transistor device is, for example, mirror symmetric relative to an axis penetrating through the body region along a normal direction of the substrate.

According to an embodiment of the invention, in the transistor structure, the transistor device may further include a third well region. The third well region is located in the substrate and has the second conductive type. The body region and the drift region are located in the third well region.

According to an embodiment of the invention, in the transistor structure, the transistor device may further include a second isolation structure. The second isolation structure is disposed in the substrate and is located between the second doped region and the third doped region.

According to an embodiment of the invention, in the transistor structure, a portion of the gate structure is, for example, located on the second isolation structure.

According to an embodiment of the invention, in the transistor structure, the transistor device is, for example, a lateral diffused metal-oxide-semiconductor transistor (LD- MOS transistor) or a drain extended metal-oxide-semiconductor transistor (DEMOS transistor).

A transistor structure provided by an embodiment of the invention includes a substrate, a transistor device, a split buried layer, and a second buried layer. The substrate has a device region. The transistor device is located in the device region. The split buried layer is located under the transistor device in the substrate and includes first buried layers separated from each other. The split buried layer has an opening between adjacent two first buried layers. The second buried layer is located under the split buried layer in the substrate and seals a bottom portion of the opening. The second buried layer and the split buried layer have a first conductive type.

To sum up, in the transistor structure provided by an embodiment of the invention, the split buried layer includes the first buried layers separated from each other, the second buried layer connects the first buried layers, and the second buried layer and the split buried layer have the same first conductive type. As such, the electrical field concentration may be prevented effectively, and the breakdown voltage of the transistor structure may further be increased.

In addition, in the transistor structure provided by an embodiment of the invention, the split buried layer includes the opening between the adjacent two first buried layers, the second buried layer seals the bottom portion of the opening, and the second buried layer and the split buried layer have the same first conductive type. As such, the electrical field concentration may be prevented effectively, and the breakdown voltage of the transistor structure may further be increased.

Besides, a significant change is not required to be made to an existing process when manufacturing the transistor structure provided by an embodiment of the invention, and thus, the manufacturing process of the transistor structure may be integrated with the existing process easily.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a cross-sectional diagram of a transistor structure according to an embodiment of the invention.

DESCRIPTION OF THE EMBODIMENTS

FIG. 1 is a cross-sectional diagram of a transistor structure according to an embodiment of the invention.

With reference to FIG. 1, a transistor structure 100 includes a substrate 102, a transistor device 104, a split buried layer 106, and a buried layer 108. The substrate 102 has a device region R. The substrate 102 may include a semiconductor substrate 102a and a semiconductor layer 102b. The semiconductor substrate 102a is, for example, a silicon substrate. The semiconductor layer 102b is disposed on the semiconductor substrate 102a. The semiconductor layer 102b is, for example, an epitaxial silicon layer.

In addition, a first conductive type and a second conductive type are different conductive types. The first conductive type and the second conductive type may be one and the other one of a N-type conductive type and a P-type conductive type. In this embodiment, the N-type conductive type is taken as an example to describe the first conductive type, and the P-type conductive type is taken as an example to describe the second conductive type, which should however not be construed as limitations to the invention. In another embodiment, the first conductive type may be the P-type conductive type, and the second conductive type may be the N-type conductive type.

In this embodiment, the second conductive type (e.g., the P-type conductive type) is taken as an example to describe the conductive types of the semiconductor substrate 102a and the semiconductor layer 102b.

The transistor device 104 is located in the device region R. The transistor device 104 is, for example, a lateral diffused metal-oxide-semiconductor transistor (LDMOS transistor) or a drain extended metal-oxide-semiconductor transistor (DEMOS transistor). In this embodiment, the lateral diffused metal-oxide-semiconductor transistor (LDMOS transistor) is taken as an example to describe the transistor device 104, and the P-type metal-oxide-semiconductor transistor (PMOS transistor) is taken as an example to describe the transistor device 104, which should however not be construed as limitations to the invention.

The transistor device 104 may include a gate structure 110, a doped region 112, a doped region 114, and a doped region 116. The gate structure 110 is disposed on the substrate 102. The gate structure 110 may include a gate 118 and a gate dielectric layer 120 and may further include a spacer 122. The gate 118 is disposed on the substrate 102. A material of the gate 118 is, for example, doped polysilicon or other conductive materials. The gate dielectric layer 120 is disposed between the gate 118 and the substrate 102. A material of the gate dielectric layer 120 is, for example, silicon oxide or other dielectric materials. The spacer 122 is disposed at two sides of the gate 118 on the substrate 102. The spacer 122 may be a single-layered structure or a multi-layered structure. The single-layered structure is taken as an example to describe the spacer 122 in this embodiment. A material of the spacer 122 is, for example, silicon nitride, silicon oxide, or a combination of the foregoing.

The doped region 112 and the doped region 114 are respectively located at one side and the other side of the gate structure 110 in the substrate 102 and have the second conductive type (e.g., the P-type conductive type). The doped region 112 and the doped region 114 may respectively act as a source and a drain. The doped region 116 is located at one side of the doped region 112 away from the gate structure 110 in the substrate 102 and has the first conductive type (e.g., the N-type conductive type).

In addition, the transistor device 104 may further include at least one of a body region 124, a drift region 126, a well region 128, and an isolation structure 130. The body region 124 is located at one side of the gate structure 110 in the substrate 102 and has the first conductive type (e.g., the N-type conductive type). The doped region 112 and the doped region 116 may be located in the body region 124. The drift region 126 is located at the other side of the gate structure 110 in the substrate 102 and has the second conductive type (e.g., the P-type conductive type). The doped region 114 may be located in the drift region 126. The well region 128 is located in the substrate 102 and has the second conductive type (e.g., the P-type conductive type). The body region 124 and the drift region 126 may be located in the well region 128.

The isolation structure 130 is disposed in the substrate 102 and is located between the doped region 112 and the doped region 114. A portion of the gate structure 110 is, for example, located on the isolation structure 130. The isolation structure 130 is a shallow trench isolation structure, for example.

In addition, the transistor device 104 is, for example, mirror symmetric relative to an axis A penetrating through the body region 124 along a normal direction of the substrate 102.

The split buried layer 106 is located under the transistor device 104 in the substrate 102 and includes buried layers 106a separated from each other. Nevertheless, as long as a number of the buried layers 106a is plural, it may fall within a rang claimed by the invention, and the number is not limited to the number illustrated in FIG. 1. The split buried layer 106 may be located between the semiconductor substrate 102a and the semiconductor layer 102b. The buried layer 108 is located under the split buried layer 106 in the substrate 102 and connects the buried layers 106a. In an embodiment, the split buried layer 106 has an opening 132 between adjacent two buried layers 106a, and the split buried layer 108 seals a bottom portion of the opening 132. The buried layer 108 and the split buried layer 106 have the first conductive type (e.g., the N-type conductive type).

In addition, the split buried layer 106 and the buried layer 108 may form a stepped structure at a position in which the buried layer 108 and the split buried layer 106 are connected. A portion of the buried layer 108 overlapping the split buried layer 106, for example, does not exceed two ends of the split buried layer 106.

In addition, the transistor structure 100 may further include at least one of a well region 134, a well region 136, a doped region 138, an isolation structure 140, and an isolation structure 142. The well region 134 is located at one side of the transistor device 104 in the substrate 102 and is connected to the split buried layer 106. The well region 134 has the first conductive type (e.g., the N-type conductive type). The split buried layer 106, the buried layer 108, and the well region 134 may surround the transistor device 104. The well region 136 is located in the well region 134 and has the first conductive type (e.g., the N-type conductive type). The doped region 138 is located in the well region 136 and has the first conductive type (e.g., the N-type conductive type).

The isolation structure 140 is disposed in the substrate 102 and is located between the well region 134 and the transistor device 104. The isolation structure 142 is disposed in the substrate 102 and is located at one side of the doped region 138 away from the transistor device 104 in the substrate 102. The isolation structure 140 and the isolation structure 142 are, for example, shallow trench isolation structures.

As described above, in an embodiment, the split buried layer 106 includes the buried layers 106a separated from each other, the buried layer 108 connects the buried layers 106a, and the buried layer 108 and the split buried layer 106 have the same first conductive type. As such, the electrical field concentration may be prevented effectively, and the breakdown voltage of the transistor structure 100 may further be increased.

In addition, in an embodiment, the split buried layer 106 includes the opening 132 between the adjacent two buried layers 106a, the buried layer 108 seals the bottom portion of the opening 132, and the buried layer 108 and the split buried layer 106 have the same first conductive type. As such, the electrical field concentration may be prevented effectively, and the breakdown voltage of the transistor structure 100 may further be increased.

Besides, a significant change is not required to be made to an existing process when manufacturing the transistor structure 100, and thus, the manufacturing process of the transistor structure 100 may be integrated with the existing process easily.

In view of the foregoing, the breakdown voltage of the transistor structure provided by the embodiments of the invention may be increased through the split buried layer and another buried layer located below the split buried layer, and moreover, the manufacturing process of the transistor structure may be integrated with the existing process easily.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A transistor structure, comprising:
   a substrate, having a device region;
   a transistor device, located in the device region;
   a split buried layer, located under the transistor device in the substrate and comprising at least three first buried layers separated from each other; and
   a second buried layer, located under the split buried layer in the substrate and connecting the first buried layers, wherein the second buried layer and the split buried layer have a first conductive type.

2. The transistor structure as claimed in claim 1, wherein the split buried layer and the second buried layer form a stepped structure at a position in which the second buried layer and the split buried layer are connected.

3. The transistor structure as claimed in claim 1, wherein a portion of the second buried layer overlapping the split buried layer does not exceed two ends of the split buried layer.

4. The transistor structure as claimed in claim 1, wherein the substrate comprises:
   a semiconductor substrate; and
   a semiconductor layer, disposed on the semiconductor substrate.

5. The transistor structure as claimed in claim 4, wherein the semiconductor substrate and the semiconductor layer have a second conductive type.

6. The transistor structure as claimed in claim 4, wherein the semiconductor layer comprises an epitaxial silicon layer.

7. The transistor structure as claimed in claim 4, wherein the split buried layer is located between the semiconductor substrate and the semiconductor layer.

8. The transistor structure as claimed in claim 1, further comprising:
   a first well region, located at one side of the transistor device in the substrate and connected to the split buried layer, wherein the first well region has the first conductive type.

9. The transistor structure as claimed in claim 8, wherein the split buried layer, the second buried layer, and the first well region surround the transistor device.

10. The transistor structure as claimed in claim 8, further comprising:
    a second well region, located in the first well region and has the first conductive type.

11. The transistor structure as claimed in claim 10, further comprising:

a first doped region, located in the second well region and having the first conductive type.

12. The transistor structure as claimed in claim 8, further comprising:
a first isolation structure, disposed in the substrate and located between the first well region and the transistor device.

13. The transistor structure as claimed in claim 1, wherein the transistor device comprises:
a gate structure, disposed on the substrate;
a second doped region and a third doped region, respectively located at one side and the other side of the gate structure in the substrate and having a second conductive type; and
a fourth doped region, located at one side of the second doped region away from the gate structure in the substrate and having the first conductive type.

14. The transistor structure as claimed in claim 13, wherein the transistor device further comprises:
a body region, located at one side of the gate structure in the substrate and having the first conductive type, wherein the second doped region and the fourth doped region are located in the body region; and
a drift region, located at the other side of the gate structure in the substrate and having the second conductive type, wherein the third doped region is located in the drift region.

15. The transistor structure as claimed in claim 14, wherein the transistor device is mirror symmetric relative to an axis penetrating through the body region along a normal direction of the substrate.

16. The transistor structure as claimed in claim 14, wherein the transistor device further comprises:
a third well region, located in the substrate and having the second conductive type, wherein the body region and the drift region are located in the third well region.

17. The transistor structure as claimed in claim 13, wherein the transistor device further comprises:
a second isolation structure, disposed in the substrate and located between the second doped region and the third doped region.

18. The transistor structure as claimed in claim 17, wherein a portion of the gate structure is located on the second isolation structure.

19. The transistor structure as claimed in claim 1, wherein the transistor device comprises a lateral diffused metal-oxide-semiconductor transistor or a drain extended metal-oxide-semiconductor transistor.

20. A transistor structure, comprising:
a substrate, having a device region;
a transistor device, located in the device region;
a split buried layer, located under the transistor device in the substrate and comprising at least three first buried layers separated from each other, wherein the split buried layer has an opening between adjacent two first buried layers; and
a second buried layer, located under the split buried layer in the substrate and sealing a bottom portion of the opening, wherein the second buried layer and the split buried layer have a first conductive type.

* * * * *